United States Patent
Hung et al.

(10) Patent No.: US 12,550,456 B2
(45) Date of Patent: Feb. 10, 2026

(54) TRENCH GATE METAL OXIDE SEMICONDUCTOR FIELD EFFECT TRANSISTOR AND METHOD OF MANUFACTURE

(71) Applicant: NEXPERIA B.V., Nijmegen (NL)

(72) Inventors: Pei Heng Hung, Nijmegen (NL); Steffen Holland, Nijmegen (NL); Chinmoy Khaund, Nijmegen (NL); Manoj Kumar, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 585 days.

(21) Appl. No.: 17/970,965

(22) Filed: Oct. 21, 2022

(65) Prior Publication Data
US 2023/0128440 A1    Apr. 27, 2023

(30) Foreign Application Priority Data
Oct. 21, 2021 (EP) .................................. 21203891

(51) Int. Cl.
H10D 89/60 (2025.01)
H10D 30/01 (2025.01)
H10D 30/66 (2025.01)

(52) U.S. Cl.
CPC ....... H10D 89/931 (2025.01); H10D 30/0297 (2025.01); H10D 30/665 (2025.01); H10D 30/668 (2025.01); H10D 89/611 (2025.01); H10D 89/921 (2025.01)

(58) Field of Classification Search
None
See application file for complete search history.

(56) References Cited

U.S. PATENT DOCUMENTS

| | | |
|---|---|---|
| 2009/0140333 A1 | 6/2009 | Pan et al. |
| 2016/0126235 A1 | 5/2016 | Nishimura |
| 2018/0277437 A1 | 9/2018 | Yamada et al. |
| 2020/0273855 A1 * | 8/2020 | Park ...................... H10D 8/022 |
| 2022/0102549 A1 * | 3/2022 | Weyers .............. H10D 62/8325 |

FOREIGN PATENT DOCUMENTS

EP    3979331 A1    4/2022

OTHER PUBLICATIONS

Extended European Search Report for corresponding European application EP21203891.3 8 pages dated Apr. 21, 2022.

* cited by examiner

*Primary Examiner* — Nilufa Rahim
(74) *Attorney, Agent, or Firm* — Ruggiero McAllister & McMahon LLC

(57) ABSTRACT

A MOSFET is provided, including a semiconductor body having a first major surface, a trench extending into the body from the first major surface to a gate region, the body including: a source region of a first conductivity type adjacent a sidewall of the trench at the first major surface, a drain region of the first conductivity type adjacent the trench distant from the source region, and a channel-accommodating region of a second conductivity type opposite to the first conductivity type, adjacent the sidewall of the trench between the source region and the drain region. The semiconductor body includes an Electro Static Discharge (ESD) region of the first conductivity type spaced apart from the trench and extending from the first major surface towards, but not into, the drain region. The ESD region includes a first region of the second conductivity type connected to the gate region.

12 Claims, 4 Drawing Sheets

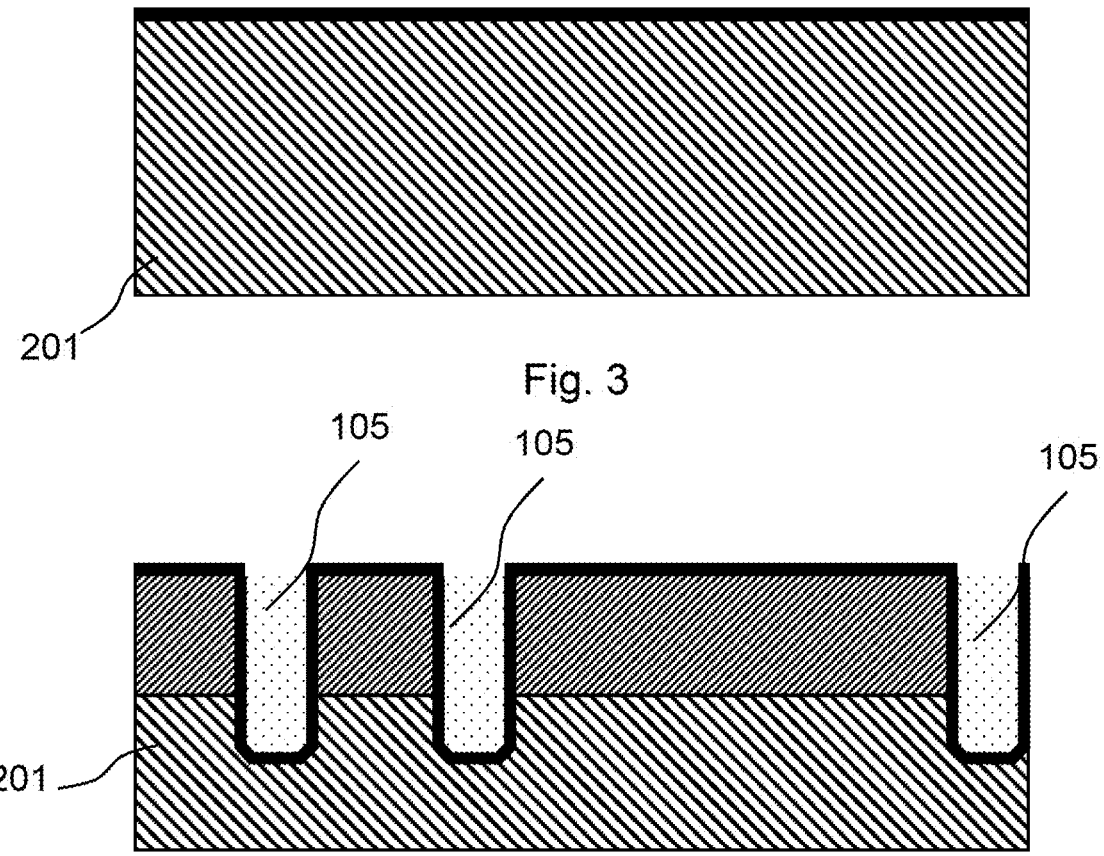
Fig. 3
Fig. 4
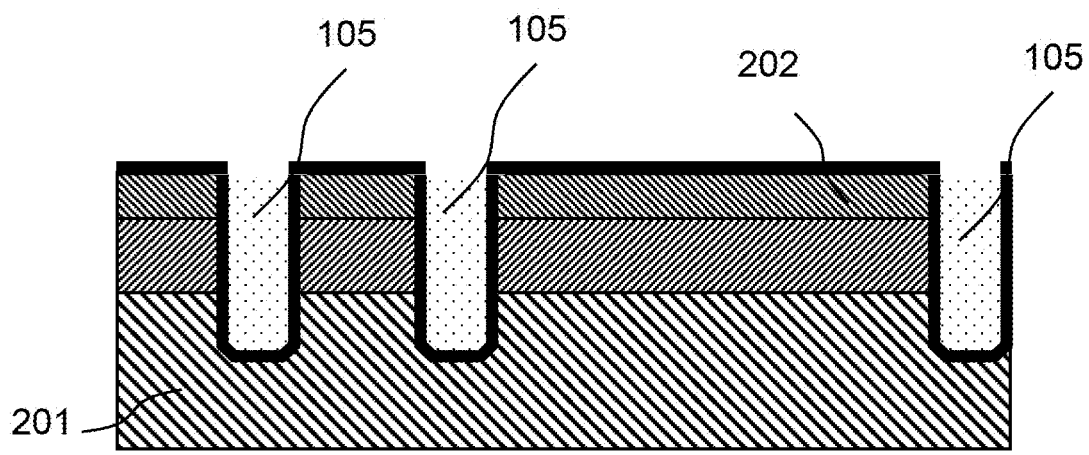
Fig. 5

TRENCH GATE METAL OXIDE SEMICONDUCTOR FIELD EFFECT TRANSISTOR AND METHOD OF MANUFACTURE

CROSS REFERENCE TO RELATED APPLICATION

This application claims the benefit under 35 U.S.C. § 119 (a) of European Application No. 21203891.3 filed Oct. 21, 2021, the contents of which are incorporated by reference herein in their entirety.

BACKGROUND OF THE DISCLOSURE

1. Field of the Disclosure

The present disclosure relates to the field of Metal Oxide Semiconductor, MOS, Field Effect Transistors, FETs, and, more specifically, to Electrostatic Discharge, ESD, protection for such MOSFETs.

2. Description of the Related Art

A Trench Gate Metal Oxide Semiconductor, MOS, Field Effect Transistor, FET, typically comprises a source region towards a first major surface of the MOSFET and a drain region formed on a second major surface, opposite to the first major surface. The source and drain region have the same conductivity type.

A channel-accommodating region, i.e. a body region, is provided between the source and drain region, which channel-accommodating region is of a different conductivity type to that of the source and drain region. A conductive channel is to be construed between the source region and the drain region to assure that the MOSFET is turned on. To facilitate the creation of such a channel, a trench gate electrode is provided close to, but not in electrical contact with, the channel-accommodating region.

Typical for the trench gate MOSFET is that the current is conducted vertically from one surface to the other so as to achieve a high drive capability. It may be realized by packing trenches on a chip, deep enough to cross the oppositely doped body region, i.e. channel-accommodating region, below the top surface.

The gate trench is typically provided with some sort of oxide, to assure that the gate electrode is electrically isolated from the channel-accommodating region. Providing a voltage bias at the gate trench will then produce an electrical field which extends into, and thus also locally depletes and/or inverts, the channel-accommodating region.

Trench gate MOSFETs are able to cope with high voltage operations, for example in the region of 100V or above. In addition, such MOSFETs may be able to cope with high reverse bias voltages between the source region and the drain region, without that the MOSFET will break down of pass any significant reverse current.

The above is typically achieved by introducing a drift region between the drain region and the channel-accommodating region, wherein the drift region has the same conductivity type as the source region and the drain region. The drift region, however, typically has a lower doping concentration. The drain region forms a PN junction at the interface with the channel-accommodating region which serves to block the reverse bias current.

For N-channel MOSFETs, the drain region is positive relative to the source region. If the source region is positive relative to the drain region, then the body-drain junction may become biased and current may be conducted via the drain region and the source region. Alternatively, for P-channel MOSFETs, the drain region is negative relative to the source region. If the source region is negative relative to the drain region, then the body-drain junction may again conduct current. The breakdown voltage is dependent on the thickness of the drift region wherein the greater the thickness, the higher the breakdown voltage.

When comparing the more conventional lateral MOSFETs with vertical trench-gate MOSFETs, like the one described above, it is clear that in vertical trench-gate MOSFETs, the channel regions are designed along the vertical walls of the trenches, rather than laterally. This allows for a high density of channels, i.e. two for each trench, per unit area of the device.

One of the downsides of MOSFETs is that they may be prone Electrostatic Discharge, ESD.

SUMMARY

A summary of aspects of certain examples disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects and/or a combination of aspects that may not be set forth.

It is an object of the present disclosure to provide for a Metal Oxide Semiconductor, MOS, Field Effect Transistor, FET, MOSFET, that has an inherent Electrostatic Discharge, ESD, protection.

It is a further object of the present disclosure to provide for associated methods and for a discrete packages MOSFET.

In a first aspect, there is provided a MOSFET, comprising a semiconductor body having a first major surface, and a trench extending into the semiconductor body from the first major surface and connected to a gate region, the semiconductor body comprising:
  a source region of a first conductivity type adjacent a sidewall of the trench at the first major surface;
  a drain region of the first conductivity type adjacent the trench at a position distant from the source region;
  a channel-accommodating region, of a second conductivity type opposite to the first conductivity type, adjacent the sidewall of the trench between the source region and the drain region,
  wherein the semiconductor body further comprises an Electro Static Discharge, ESD, region of the first conductivity type, spaced apart from the trench and extending from the first major surface towards, but not into, the drain region, wherein the ESD region comprises a first region of the second conductivity type, wherein the first region is connected to the gate region.

It is noted that a source contact may be electrically connected to the source region, a drain contact may be electrically connected to the drain region and a gate contact may be electrically connected to the gate region.

The channel-accommodating region may abut the source region on a side opposite to the side of the source region which abuts the trench.

The inventors have found that it may be beneficial to incorporate ESD protection in the semiconductor body. One of the advantages is that the leakage current may be kept really low, for example a couple of nano Ampere.

ESD protection is provided by introducing at least one "component" that has an interface or a boundary between two semiconductor material types, for example the p-type and the n-type, inside a semiconductor body.

In order to accomplish such ESD protection, the semiconductor body comprises an ESD region of the first conductivity type. The ESD region should be spaced apart from the trench to not interfere with the normal operation of the MOSFET too much. The ESD region should also no extend into the drain region as that would intervene with the normal operation of the MOSFET as well.

Further, inside the ESD region, a first region of the second conductivity type, wherein the first region is connected to the gate region. The gate region is thus connected to the first region having second conductivity type, which first region resides in the ESD region that has a first conductivity type. This may thus form an PN junction, or the like, acting as ESD protection.

In accordance with the present disclosure, the MOSFET may comprise a plurality of gate trenches, wherein the ESD region is provided between the gate trenches.

In an example, the ESD region further comprises a second region of the second conductivity type, wherein the second region is spaced apart from the first region, and wherein the second region is connected to a body region.

The above effectively establishes the introduction of two back to back diodes between the gate region and a body, as there are two interfaces or a boundaries between two semiconductor material types. The diodes are oriented in that the cathodes of the diodes are connected to each other. This is accomplished by the layout of the ESD region and the first and second regions inside that ESD region.

In a more detailed example hereof, the semiconductor body further comprises a second ESD region of the first conductivity type, spaced apart from the trench and extending from the first major surface towards, but not into, the drain region, wherein the second ESD region comprises a third region of the second conductivity type, wherein the third region is connected to the source region.

The second ESD region is similar to the first ESD region with the difference that the third region inside the second ESD region is connected to the source region whereas in the first ESD region the first region is connected to the gate region.

The second ESD region and the first ESD region may, or may not, be separated from each other. Both regions may be combined in one single ESD region. Preferably, the regions separated.

Typically, a MOSFET in accordance with the present disclosure comprises a plurality of trenches, wherein the above mentioned ESD regions are oriented between any of those trenches.

In a more detailed example, the second ESD region further comprises a fourth region of the second conductivity type, wherein the fourth region is spaced apart from the third region, and wherein the fourth region is connected to the body region.

This preferred example discloses, effectively, four back to back diodes connected between the gate region and the source region. Two diodes are placed back to back between the gate region and the body region. Two diodes are placed back to back between the body region and the source region.

In a further example, the ESD region extends into the channel-accommodating region.

Typically, the first conductivity type is N-type, and wherein the second conductivity type is P-type.

In a further example, the semiconductor body further comprises:
a drift region, of said first conductivity type, wherein the drift region is between the drain region and the channel-accommodating region.

The drift region determines, amongst other, the reverse breakdown voltage of the MOSFET. The drift region is, typically, lightly doped such that the MOSFET has a high reverse breakdown voltage.

In yet another example, the ESD regions extend from the first major surface towards, but not into, the drift region.

In a further example, the trench extends from the first major surface into said drift region.

In a second aspect of the present disclosure, there is provided a method of manufacturing a Metal Oxide Semiconductor, MOS, Field Effect Transistor, FET, in accordance with any of the previous claims, wherein said method comprises the steps of:
forming a semiconductor body having a source region of a first conductivity type adjacent a sidewall of the trench at the first major surface, a drain region of the first conductivity type adjacent the trench at a position distant from the source region, a channel-accommodating region, of a second conductivity type opposite to the first conductivity type, adjacent the sidewall of the trench between the source region and the drain region,
forming a trench extending into the semiconductor body from the first major surface and connected to a gate region;
forming an Electro Static Discharge, ESD, region of the first conductivity type, spaced apart from the trench and extending from the first major surface towards, but not into, the drain region, wherein the ESD region comprises a first region of the second conductivity type, wherein the first region is connected to the gate region.

It is noted that the advantages as explained with reference to the first aspect of the present disclosure, being the MOSFET, are also applicable to the second aspect of the present disclosure, being the method to manufacture such a MOSFET.

In an example, the method further comprises the step of:
forming, in said ESD region, a second region of the second conductivity type, wherein the second region is spaced apart from the first region, and wherein the second region is connected to a body region.

In a further example, the method further comprises the step of:
forming, a second ESD region of the first conductivity type, spaced apart from the trench and extending from the first major surface towards, but not into, the drain region, wherein the second ESD region comprises a third region of the second conductivity type, wherein the third region is connected to the source region.

In an example, the method further comprises the step of:
forming, in the second ESD region, a fourth region of the second conductivity type, wherein the fourth region is spaced apart from the third region, and wherein the fourth region is connected to the body region.

In a further example, the first conductivity type is N-type, and wherein the second conductivity type is P-type.

In a third aspect of the present disclosure, there is provided a discrete packaged Metal Oxide Semiconductor, MOS, Field Effect Transistor, FET, comprising a MOSFET in accordance with any of the examples as provided above.

The present disclosure is described in conjunction with the appended figures. It is emphasized that, in accordance with the standard practice in the industry, various features are not drawn to scale. In fact, the dimensions of the various features may be arbitrarily increased or reduced for clarity of discussion.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

The above and other aspects of the disclosure will be apparent from and elucidated with reference to the examples described hereinafter.

BRIEF DESCRIPTION OF THE DRAWINGS

FIGS. 3, 4, 5, 6, 7 and 8 disclose different steps in the process of manufacturing a MOSFET in accordance with the present disclosure.

It is noted that in the description of the figures, same reference numerals refer to the same or similar components performing a same or essentially similar function.

DETAILED DESCRIPTION

Figure 1:
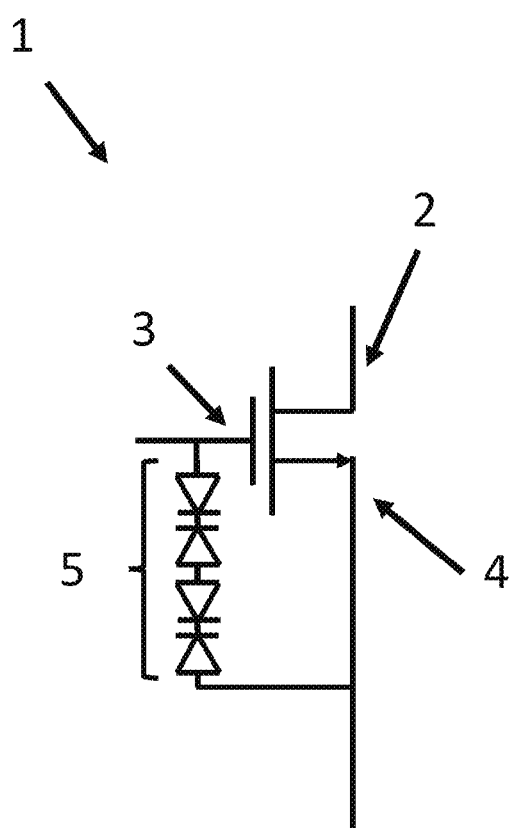
FIG. 1 discloses Electro Static Discharge, ESD, protection for a Metal oxide Semiconductor, MOS, Field Effect Transistor, FET.

A more detailed description is made with reference to particular examples, some of which are illustrated in the appended drawings, such that the manner in which the features of the present disclosure may be understood in more detail. It is noted that the drawings only illustrate typical examples and are therefore not to be considered to limit the scope of the subject mater of the claims. The drawings are incorporated for facilitating an understanding of the disclosure and are thus not necessarily drawn to scale. Advantages of the subject matter as claimed will become apparent to those skilled in the art upon reading the description in conjunction with the accompanying drawings.

The ensuing description above provides preferred exemplary embodiment(s) only, and is not intended to limit the scope, applicability or configuration of the disclosure. Rather, the ensuing description of the preferred exemplary embodiment(s) will provide those skilled in the art with an enabling description for implementing a preferred exemplary embodiment of the disclosure, it being understood that various changes may be made in the function and arrangement of elements, including combinations of features from different embodiments, without departing from the scope of the disclosure.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, electromagnetic, or a combination thereof. Additionally, the words "herein," "above," "below," and words of similar import, when used in this application, refer to this application as a whole and not to any particular portions of this application. Where the context permits, words in the Detailed Description using the singular or plural number may also include the plural or singular number respectively. The word "or" in reference to a list of two or more items, covers all of the following interpretations of the word: any of the items in the list, all of the items in the list, and any combination of the items in the list.

These and other changes can be made to the technology in light of the following detailed description. While the description describes certain examples of the technology, and describes the best mode contemplated, no matter how detailed the description appears, the technology can be practiced in many ways. Details of the system may vary considerably in its specific implementation, while still being encompassed by the technology disclosed herein. As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the Detailed Description section explicitly defines such terms. Accordingly, the actual scope of the technology encompasses not only the disclosed examples, but also all equivalent ways of practicing or implementing the technology under the claims.

FIG. 1 discloses Electro Static Discharge, ESD, protection for a Metal oxide Semiconductor, MOS, Field Effect Transistor, FET 1 having a source 4, a drain 2 and a gate 3 terminal.

In MOSFETs, there are typically three basic ESD induced failures namely junction damage, gate oxide damage and metallization burnout. These failures are usually thermally induced, indicating that damage occurs once the temperature of the local area exceeds a critical value, often the melting point of the material.

Junction damage may be caused by the injection of an ESD transient of sufficient energy and duration to force the junction into secondary breakdown. Junction damage is often characterized by high reverse bias leakage current or a total short.

The so-called gate oxide damage may occur when the gate 3 is subjected to an ESD pulse of high enough magnitude to cause the gate oxide to breakdown. For MOSFETs, the gate oxide is typically very thin resulting in varying degrees of ESD sensitivity.

Metallization burnout may exist in metal interconnects or contacts. It may occur if any current flowing through the metal forces a temperature rise that is high enough to reach the melting point of the material. Metallization burnout is often a secondary effect, occurring after the initial junction or gate oxide failure.

To protect a MOSFET from ESD, the main objective is typically to clamp the gate 3 to source 4 voltage from reaching the destructive voltage. A typical ESD protection device 5 clamps the voltage to a lower value at the occurrence of the ESD strike to minimize the voltage seen at the gate of MOSFET. The protection device may shunt current to ground and away from the protected gate 3.

During this period, the clamping voltage and residual current seen at the gate 3 may depend upon the breakdown voltage and the dynamic resistance of the protection device. Once the ESD strike is fully dissipated, the ESD protection device 5 attempts to return to a high impedance state. There are several types of ESD protection devices 5 available today, but most commonly used are Transient-voltage-suppression, TVS, and Zener diodes. In FIG. 1, four cascaded diodes 5 are shown that operate as ESD protection for the MOSFET.

One of the downsides of using such a topology as shown in FIG. 1 is that the leakage current from gate 3 to source 4 is relatively high.

Figure 2:
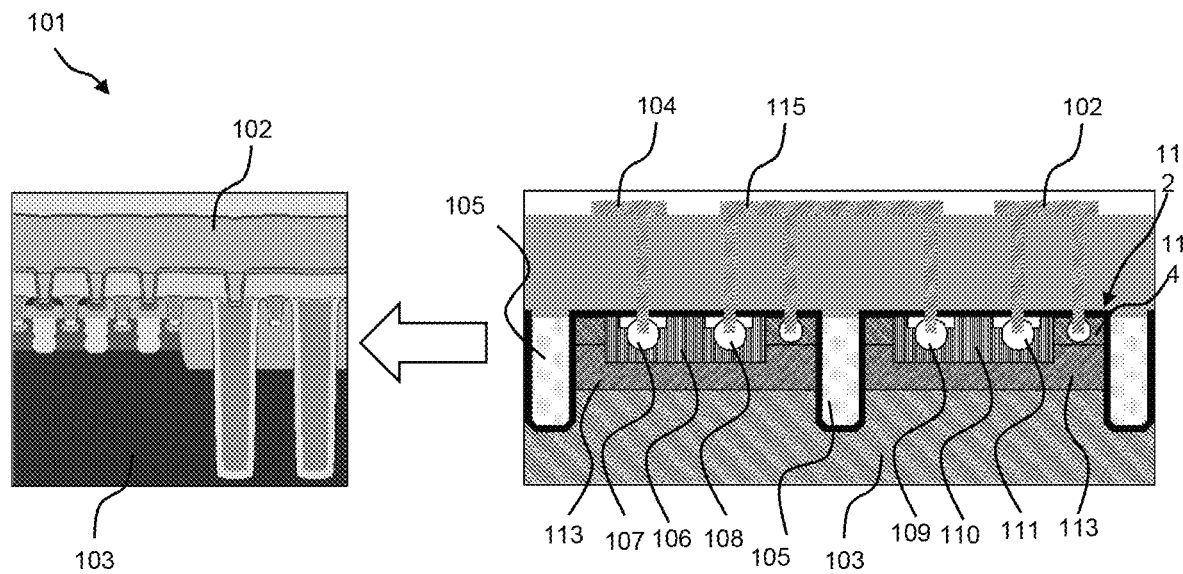
FIG. 2 discloses a schematic overview as well as a realistic implementation of a MOSFET in accordance with the present disclosure.

FIG. 2 discloses 101 a schematic overview as well as a realistic implementation of a MOSFET in accordance with the present disclosure.

At the right hand side of FIG. 2 a schematic overview is provided of a MOSFET in accordance with the present disclosure and at the left hand side an actual manufactured example is provided.

The MOSFET 101 shown in FIG. 2 comprises a semiconductor body having a first major surface 112, and a trench 105 extending from the first major surface 112 into the semiconductor body. The trench 105 is connected to a gate region (not shown). The trench 105 comprises an isolating material, for example an oxide, to assure that there is no electrical contact with the remainder of the semiconductor body.

A substrate 103 is provided that forms the drain region 103 of the MOSFET. It is noted that the substrate may be split into a drain region and a drift region but is not further elucidated in more detail with respect to FIG. 2.

A channel-accommodating region 113 is provided, wherein the channel-accommodating region 113 is abut the trench 105. As such, the properties of the channel-accommodating region 113 may be altered by inducing an electrical voltage at the gate terminal connected to the trench 105.

The source region is indicated with reference numeral 114. The source region is indicated with reference numeral 114 and/or 102

The MOSFET shown in FIG. 2 discloses a so-called NPN MOSFET. The source region is of the N-type, the channel-accommodating region is of the P-type and the drain region is of the N-type.

According to the present disclosure at least one ESD region 106 is provided, wherein the ESD region 106 is spaced apart from the trench 105, and extends from the first major surface 112 towards, but not into, the drain region 103, wherein the ESD region 106 comprises a first region 107 of the second conductivity type, wherein the first region is connected to the gate region.

The latter is shown as there is an electrical connection towards the gate contact as indicated with reference numeral 104. In the present case, the second conductivity type is the P-type given that FIG. 2 discloses the so-called NPN MOSFET. The ESD region is thus of the N-type and the first region is of the P-type.

The above entails that the ESD region 106 extends, and ends, in the channel-accommodating region 113 and/or the source region 114.

In the present case, the ESD region 106 further comprises a second region 108, wherein the second region 108 is spaced apart from the first region 107. The second region 108 is connected to a body region, which is illustrated by reference numeral 115.

The above entails that that are two back to back diodes between the gate region 104 and the body region 115.

Here below the second ESD region 110 is discussed in more detail. As mentioned above, the second ESD region 110 may be spaced apart from the first ESD region 106.

The second region comprises a third region 109 and a fourth region 111, wherein the third region 109 is connected to the body region 115 and the fourth region 111 is connected to the source region 102.

The above effectively established that there are four back to back diodes placed between the gate region 104 and the source region 102.

FIGS. 3, 4, 5, 6, 7 and 8 disclose different steps in the process of manufacturing a MOSFET in accordance with the present disclosure.

A MOSFET in accordance with the present disclosure may be manufactured according to process steps shown in FIGS. 3, 4, 5, 6, 7 and 8. A semiconductor layer may be formed on a semiconductor substrate using known techniques such as epitaxial growth or deposition. Often, the semiconductor layer is formed of silicon and is formed of the same conductivity as the semiconductor substrate which is, for example, of the N-type.

Subsequent to the formation of the semiconductor layer, which may define a drift region as explained above, one or more trenches 105 may be formed through the op major surface of the semiconductor layer forming the drift region 201. The above is illustrated in FIG. 4.

The trenches 105, which are considered to equal the gate terminals of the MOSFET, may be formed by any appropriate etching technique such that it terminates in the drift region. That is, the trench does not extend into the semiconductor substrate. Each trench 105 has opposing side walls and has a bottom.

It is noted that each trench 105 is provided with an oxide layer which is also known as a thick bottom oxide, TBO. The oxide layer may be formed by local oxidation of silicon. Likewise, the sidewalls of the trench 105 may be lined with a sidewall oxide. The sidewall oxide may also extend to cover the top major surface of the semiconductor layer forming the drift region. Following the formation of the sidewall oxide and the thick bottom oxide, a gate electrode may be formed in each of the trenches 105.

The gate electrode may also be formed by any appropriate process such as deposition. The thick bottom oxide and the sidewall oxide together form a gate oxide which is configured and arranged to electrically insulate the gate electrode from the surrounding regions like the drift region.

Turning now to FIG. 5, a P-body may be implanted to create a doped P-layer as indicated with reference numeral 202.

Figure 6:
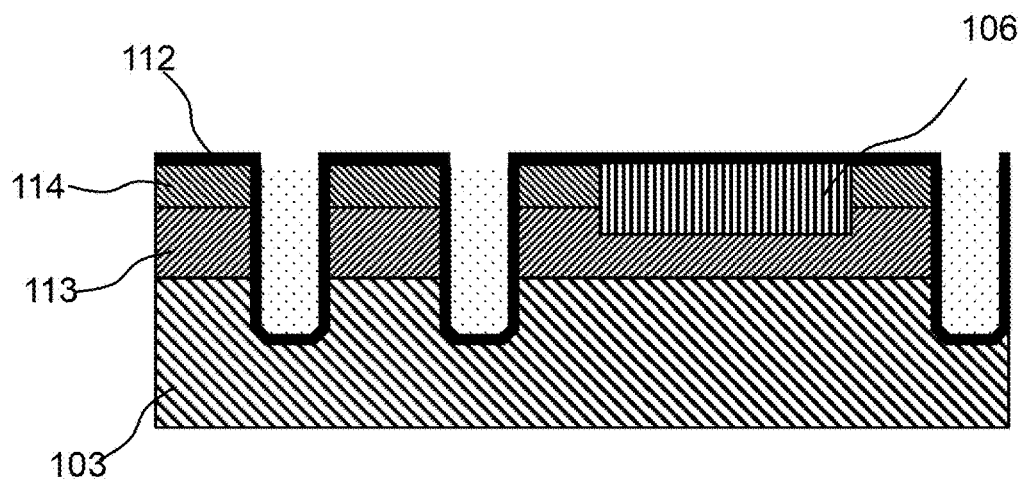
Figure 7:
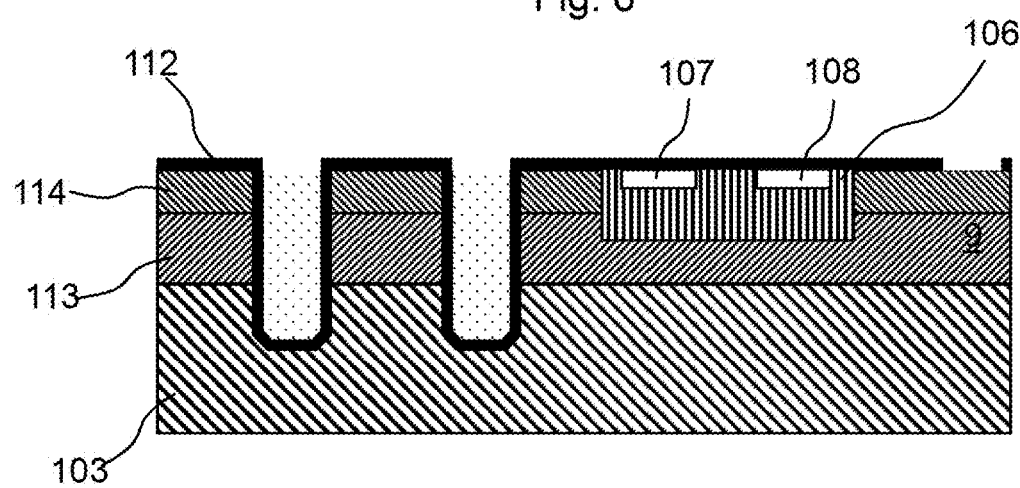
Figure 8:
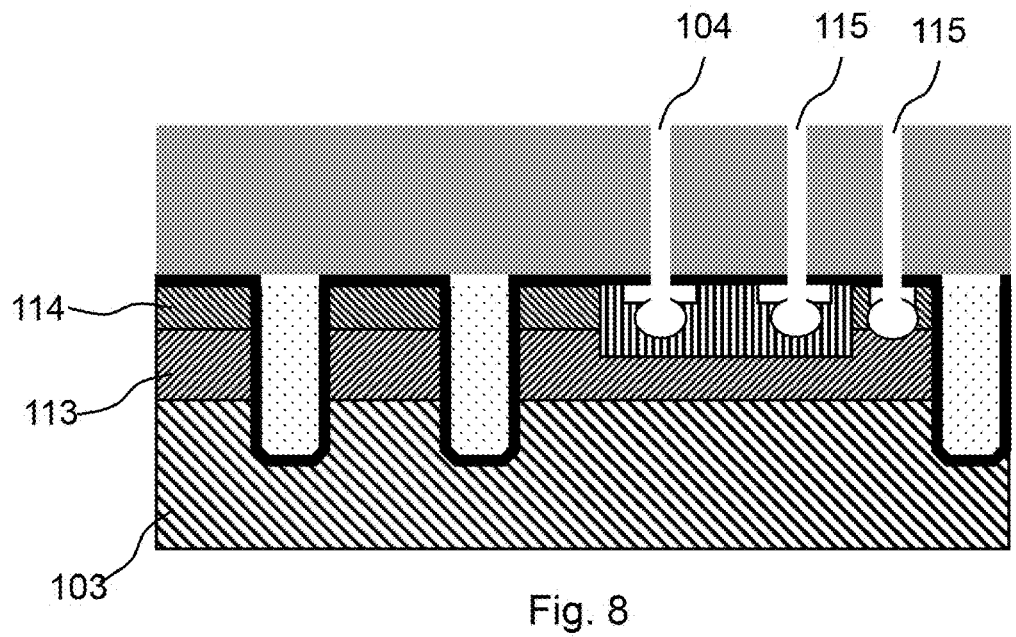

FIG. 6 shows a mask for the ESD region, and FIG. 7 shows the creation of the first and second regions inside the ESD region. Finally, the process continues until the final MOSFET is created as shown in FIG. 8.

To reduce the number of claims, certain aspects of the technology are presented below in certain claim forms, but the applicant contemplates the various aspects of the technology in any number of claim forms. For example, while some aspect of the technology may be recited as a computer-readable medium claim, other aspects may likewise be embodied as a computer-readable medium claim, or in other forms, such as being embodied in a means-plus-function claim.

In the description above, for the purposes of explanation, numerous specific details are set forth in order to provide a thorough understanding of implementations of the disclosed technology. It will be apparent, however, to one skilled in the art that embodiments of the disclosed technology may be practiced without some of these specific details.

Other variations to the disclosed embodiments can be understood and effected by those skilled in the art in practicing the claimed disclosure, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope thereof.

What is claimed is:

1. A Metal Oxide Semiconductor Field Effect Transistor (MOSFET), comprising a semiconductor body having a first major surface, and a trench extending into the semiconductor body from the first major surface and connected to a gate region, wherein the semiconductor body comprises:
    a source region of a first conductivity type adjacent a sidewall of the trench at the first major surface;
    a drain region of the first conductivity type adjacent the trench at a position distant from the source region;
    a channel-accommodating region, of a second conductivity type opposite to the first conductivity type, adjacent the sidewall of the trench between the source region and the drain region;
    wherein the semiconductor body further comprises an Electro Static Discharge (ESD) region of the first conductivity type, spaced apart from the trench and extending from the first major surface towards, but not into, the drain region;
    wherein the ESD region comprises a first region of the second conductivity type and the first region is connected to the gate region; and
    wherein the ESD region further comprises a second region of the second conductivity type; wherein the second region is spaced apart from the first region; and wherein the second region is connected to a body region between the source region and the gate region to form two back to back diodes between the gate region and the body region.

2. The MOSFET according to claim 1, wherein the ESD region extends into the channel-accommodating region.

3. The MOSFET according to claim 1, wherein the first conductivity type is N-type; and wherein the second conductivity type is P-type.

4. The MOSFET according to claim 1, wherein the semiconductor body further comprises a drift region of the first conductivity type; and
    wherein the drift region is between the drain region and the channel-accommodating region.

5. A discrete packaged MOSFET comprising the MOSFET according to claim 1.

6. The MOSFET according to claim 1, wherein the semiconductor body further comprises the second ESD region of the first conductivity type, spaced apart from the trench and extending from the first major surface towards, but not into, the drain region, wherein the second ESD region comprises a third region of the second conductivity type, and wherein the third region is connected to the source region.

7. The MOSFET according to claim 4, wherein the ESD region extends from the first major surface towards, but not into, the drift region.

8. The MOSFET according to claim 4, wherein the trench extends from the first major surface into the drift region.

9. The MOSFET according to claim 6, wherein the second ESD region further comprises a fourth region of the second conductivity type, wherein the fourth region is spaced apart from the third region, and wherein the fourth region is connected to the body region.

10. The MOSFET according to claim 7, wherein the trench extends from the first major surface into the drift region.

11. A method of manufacturing a MOSFET, wherein the method comprises the steps of:
    forming a semiconductor body having
    a source region of a first conductivity type adjacent a sidewall of the trench at the first major surface;
    a drain region of the first conductivity type adjacent the trench at a position distant from the source region; and
    a channel-accommodating region, of a second conductivity type opposite to the first conductivity type, adjacent the sidewall of the trench between the source region and the drain region;
    forming a trench extending into the semiconductor body from the first major surface and connected to a gate region;
    forming an Electro Static Discharge, ESD, region of the first conductivity type, spaced apart from the trench and extending from the first major surface towards, but not into, the drain region;
    wherein the ESD region comprises a first region of the second conductivity type;
    wherein the first region is connected to the gate region; and
    wherein the method further comprises the step of forming, in the ESD region, a second region of the second conductivity type, wherein the second region is spaced apart from the first region; and wherein the second region is connected to a body region between the source region and the gate region.

12. The method according to claim 11, further comprising the step of forming, in the ESD region, the second region of the second conductivity type, spaced apart from the trench and extending from the first major surface towards, but not into, the drain region, wherein the second ESD region comprises a third region of the second conductivity type, and wherein the third region is connected to the source region.

* * * * *